(12) United States Patent
Al Alam et al.

(10) Patent No.: US 12,457,761 B2
(45) Date of Patent: Oct. 28, 2025

(54) MONOLITHIC INTEGRATION OF ENHANCEMENT-MODE AND DEPLETION-MODE GALIUM NITRIDE HIGH ELECTRON MOBILITY TRANSISTORS

(71) Applicant: NATIONAL RESEARCH COUNCIL OF CANADA, Ottawa (CA)

(72) Inventors: Elias Al Alam, Gloucester (CA); Alireza Loghmany, Kanata (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 391 days.

(21) Appl. No.: 18/252,973

(22) PCT Filed: Nov. 3, 2021

(86) PCT No.: PCT/IB2021/060186
§ 371 (c)(1),
(2) Date: May 15, 2023

(87) PCT Pub. No.: WO2022/101740
PCT Pub. Date: May 19, 2022

(65) Prior Publication Data
US 2024/0014291 A1    Jan. 11, 2024

Related U.S. Application Data

(60) Provisional application No. 63/114,239, filed on Nov. 16, 2020.

(51) Int. Cl.
*H10D 30/01*     (2025.01)
*H10D 30/47*     (2025.01)
(Continued)

(52) U.S. Cl.
CPC ......... *H10D 30/015* (2025.01); *H10D 30/475* (2025.01); *H10D 62/221* (2025.01); *H10D 62/8503* (2025.01)

(58) Field of Classification Search
CPC .. H10D 30/015; H10D 30/475; H10D 62/221; H10D 62/8503; H10D 30/62;
(Continued)

(56) References Cited

U.S. PATENT DOCUMENTS 12,040,393 B2 * 7/2024 Su .................. H10D 30/478
2007/0228416 A1 * 10/2007 Chen ................ H10D 30/4755
                                                    257/192

(Continued)

FOREIGN PATENT DOCUMENTS

WO    WO-2020240310 A1    12/2020

OTHER PUBLICATIONS

Horikiri, Fumimasa, et al. "Photoelectrochemical etching technology for gallium nitride power and RF devices." IEEE transactions on semiconductor manufacturing 32.4 (2019): 489-495.
(Continued)

*Primary Examiner* — S M Sohel Imtiaz
(74) *Attorney, Agent, or Firm* — Perry + Currier Inc.

(57) ABSTRACT

A device and method of fabricating a device having depletion-mode and enhancement-mode high-electron-mobility transistors (HEMTs) on a single wafer are disclosed. The method of fabrication involves providing semiconductor layers capable of sustaining a two-dimensional electron sheet to enable electrical current to flow through the HEMT, forming a series of trenches and fins in the semiconductor layers over an active area of the semiconductor layers on which a gate contact terminal is to be set down, the fins of
(Continued)

respective HEMTs having different widths resulting in different voltage thresholds for the respective depletion-mode HEMTs.

15 Claims, 9 Drawing Sheets

(51) Int. Cl.
*H10D 62/17* (2025.01)
*H10D 62/85* (2025.01)

(58) Field of Classification Search
CPC ...... H10D 62/292; H10D 84/84; H10D 84/01; H10D 84/05; H10D 84/82
See application file for complete search history.

(56) References Cited

U.S. PATENT DOCUMENTS

| | | | | |
|---|---|---|---|---|
| 2008/0308813 | A1* | 12/2008 | Suh | H10D 30/4755 257/E29.127 |
| 2018/0166565 | A1* | 6/2018 | Chen | H10D 30/015 |
| 2018/0197999 | A1* | 7/2018 | Palacios | H10D 30/4755 |
| 2020/0161461 | A1* | 5/2020 | Lee | H10D 64/258 |
| 2020/0295170 | A1* | 9/2020 | Dayeh | H10D 30/62 |

OTHER PUBLICATIONS

Lin, Shuxun, et al. "A GaN HEMT structure allowing self-terminated, plasma-free etching for high-uniformity, high-mobility enhancement-mode devices." IEEE Electron Device Letters 37.4 (2016): 377-380.

Alsharef, M. et al., Performance of Tri-Gate AlGaN/GaN HEMTs, IEEE Trans. On Electron Devices, vol. 60, No. 10, 2013.

Cai, Yong, et al. "High-performance enhancement-mode AlGaN/GaN HEMTs using fluoride-based plasma treatment." IEEE Electron Device Letters 26.7 (2005): 435-437.

Cai, Yong, et al. "Monolithic integration of enhancement-and depletion-mode AlGaN/GaN HEMTs for GaN digital integrated circuits." IEEE InternationalElectron Devices Meeting, 2005. IEDM Technical Digest.. IEEE, 2005.

Cai, Yong, et al. "High-temperature operation of AlGaN/GaN HEMTs direct-coupled FET logic (DCFL) integrated circuits." IEEE electron device letters 28.5 (2007): 328-331.

Kong, Yuechan, et al. "Monolithic integrated enhancement/depletion-mode AlGaN/GaN high electron mobility transistors with cap layer engineering." Applied Physics Letters 102.4 (2013).

Loghmany, Alireza et al. "Alternative isolation-feature geometries and polarization-engineering of polar AlGaN/GaN HFETs." Solid-State Electronics 103 (2015): 162-166.

Matys, M., et al. "Enhancement of channel electric field in AlGaN/GaN multi-nanochannel high electron mobility transistors." Journal of Applied Physics 124.22 (2018).

Ohi, Kota et al. "Drain current stability and controllability of threshold voltage and subthreshold current in a multi-mesa-channel AlGaN/GaN high electron mobility transistor." Japanese Journal of Applied Physics 48.8R (2009): 081002.

Ohi, Kota, et al. "Current stability in multi-mesa-channel AlGaN/GaN HEMTs." IEEE transactions on electron devices 60.10 (2013): 2997-3004.

Werquin, M., et al. "First results of AlGaN/GaN HEMTs on sapphire substrate using an argon-ion implant-isolation technology." Microwave and Optical Technology Letters 46.4 (2005): 311-315.

Zhang, Meng, et al. "Influence of fin configuration on the characteristics of AlGaN/GaN fin-HEMTs." IEEE Transactions on Electron Devices 65.5 (2018): 1745-1752.

* cited by examiner

MONOLITHIC INTEGRATION OF ENHANCEMENT-MODE AND DEPLETION-MODE GALIUM NITRIDE HIGH ELECTRON MOBILITY TRANSISTORS

FIELD

The present specification relates to high-electron-mobility transistors (HEMTs), and more particularly to monolithic integration of enhancement-mode and depletion-mode AlGaN/GaN high-electron-mobility transistors (HEMT).

BACKGROUND

A high-electron-mobility transistor (HEMT), also known as a heterostructure FET (HFET), includes a source contact terminal, a drain contact terminal, and a gate contact terminal to which a voltage may be applied to control the flow of electrical current between the source contact terminal and the drain contact terminal. Unlike, CMOS transistors, where current flows through a doped channel region, HEMTs incorporate a junction between two materials with different band gaps (i.e. a heterojunction) as the current flow channel. A HEMT may be either a depletion-mode HEMT, which is normally in an "on" state at zero gate-source voltage, or an enhancement-mode HEMT, which is normally in an "off" state at zero gate-source voltage.

HEMTs may be designed to have a high breakdown voltage, high peak electron drift velocity, and high concentration of two-dimensional electron gas. Such characteristics make HEMTs suitable for digital control applications in harsh environments such as automotive and aerospace engine controls, well logging in petroleum exploration, and nuclear reactors. These characteristics may be provided by a wide bandgap semiconductor layers made of aluminum gallium nitride (AlGaN) and gallium nitride (GaN) which create a sheet of two-dimensional electron gases (2DEG) by positive polarization induced interface charges (spontaneous and piezoelectric polarization). The formation of two-dimensional electron gases in AlGaN/GaN heterostructures rely on the difference of the polarization between the AlGaN and the GaN layers. There is a strong relationship between the concentration of the 2DEG sheet, concentration of Al and thickness of the AlGaN layer (as well as the type of metal used for the Schottky layer of the tri-gate structure, where the gate wraps around a raised source-to-drain channel instead of residing on top of the channel in the traditional 2D planar design), as discussed below.

Compared to Si and GaAs devices, GaN-based devices have fundamental advantages for high-temperature operations as well as room temperature. For Depletion-mode (D-mode) AlGaN/GaN HEMTs, a maximum operational temperature of 750° C. has been reported. However, to date, the reported operating temperature of III-Nitride based digital integrated circuits is only up to 265° C., and these integrated circuits were fabricated with an all D-mode HEMT technology having large transistor counts.

SUMMARY

According to an aspect of the specification, a method is provided for fabricating a AlGaN/GaN high-electron-mobility transistor (HEMT), the method comprising: providing semiconductor layers capable of sustaining a two-dimensional electron sheet to enable electrical current to flow through the HEMT, wherein the semiconductor layers comprise a first layer of aluminum gallium nitride (AlGaN) and a second layer of gallium nitride (GaN), whereby the concentration of Al and thickness of AlGaN give rise to a characteristic threshold voltage; forming a series of trenches and fins in the semiconductor layers in an active area of the semiconductor layers on which gate contact terminals are to be set down, wherein the width of the fins is chosen to shift the characteristic threshold voltage to a new threshold voltage, and wherein the new threshold voltage increases with reduction in the width of the fins; and setting down gate contact terminals across the fins at the active area.

According to another aspect of the specification, a method is provided of fabricating a wafer containing a plurality of high-electron-mobility transistors (HEMTs), the method comprising: providing semiconductor layers capable of sustaining a two-dimensional electron sheet to enable electrical current to flow through the HEMTs, wherein the semiconductor layers comprise a first layer of aluminum gallium nitride (AlGaN) and a second layer of gallium nitride (GaN), whereby the concentration of Al and thickness of AlGaN give rise to a characteristic threshold voltage; for a first one of said HEMTs: forming a series of first trenches and first fins in the semiconductor layers over a first active area of the semiconductor layers on which a first gate contact terminal of the first one of said HEMTs is to be set down, wherein the width of the first fins is chosen to shift the characteristic threshold voltage to a new threshold voltage; setting down the first gate contact terminal across the first fins; and setting down a first source contact terminal and a first drain contact terminal on either side of the first gate contact terminal outside of the first active area; and for a further one of said HEMTs: forming a series of further trenches and further fins in the semiconductor layers over a further active area of the semiconductor layers on which a further gate contact terminal of the HEMT is to be set down, wherein the width of the further fins is less than the width of the first fins to shift the characteristic threshold voltage below the new threshold voltage first one of said HEMTs; setting down a further gate contact terminal across the further series of fins; and setting down a further source contact terminal and a further drain contact terminal on either side of the further gate contact terminal outside of the further active area, wherein the width of each of the first fins is selected to increase the characteristic threshold voltage such that the first one of said HEMTs operate as a depletion mode HEMT, and wherein the width of the further fins is selected to decrease the characteristic threshold voltage to a voltage such that the further one of said HEMTs operates as an enhancement mode HEMT.

According to a further aspect of this specification, there is provided a incorporating monolithic integration of E-mode and D-mode AlGaN/GaN high-electron-mobility transistors (HEMTs), comprising: semiconductor layers comprising a first layer of aluminum gallium nitride (AlGaN) and a second layer of gallium nitride (GaN), said layers being capable of sustaining a two-dimensional electron sheet to enable electrical current to flow, the semiconductor layers comprising a plurality of active areas on which gate contact terminals are to be set down, the active areas comprising a series of trenches and fins, the fins having different widths over each active area; a plurality of drain contact terminals adjacent respective ones of the active areas; a plurality of source contact terminals adjacent respective ones of the active areas; and a plurality of gate contact terminals set down across the fins of respective ones of the active areas, such that the device comprises a plurality of AlGaN/GaN high-electron-mobility transistors (HEMTs) having different threshold voltages, and wherein for a first one of said HEMTs the width of each of the fins is selected to increase the characteristic threshold voltage such that the first one of said HEMTs operate as a depletion mode HEMT, and wherein for a further one of said HEMTs the width of the fins is selected to decrease the characteristic threshold voltage to a voltage such that the further one of said HEMTs operates as an enhancement mode HEMT.

In a further aspect, the gate contact of the depletion mode HEMT is connected to the source contact of the enhancement mode HEMT and the source contact of the depletion mode HEMT is connected to the drain contact of the enhancement mode HEMT, such that the device operates as a cascode power switch.

In a further aspect, the gate contact of the depletion mode HEMT is connected to the source contact of the depletion mode HEMT, the source contact of the depletion mode HEMT is connected to the drain contact of the enhancement mode HEMT, drain contact of the depletion mode HEMT is connected to a source of voltage (VDD), the gate contact of the enhancement mode HEMT is connected to an input and the gate contact of the depletion mode HEMT is connected to an output, such that the device operates as a logic inverter.

In additional aspects, the width of each of the fins of the depletion mode HEMT is in the range of from 30 nm to 500 nm and wherein the width of each of the fins of the enhancement mode HEMT is less than 30 nm.

DETAILED DESCRIPTION

Figure 1:
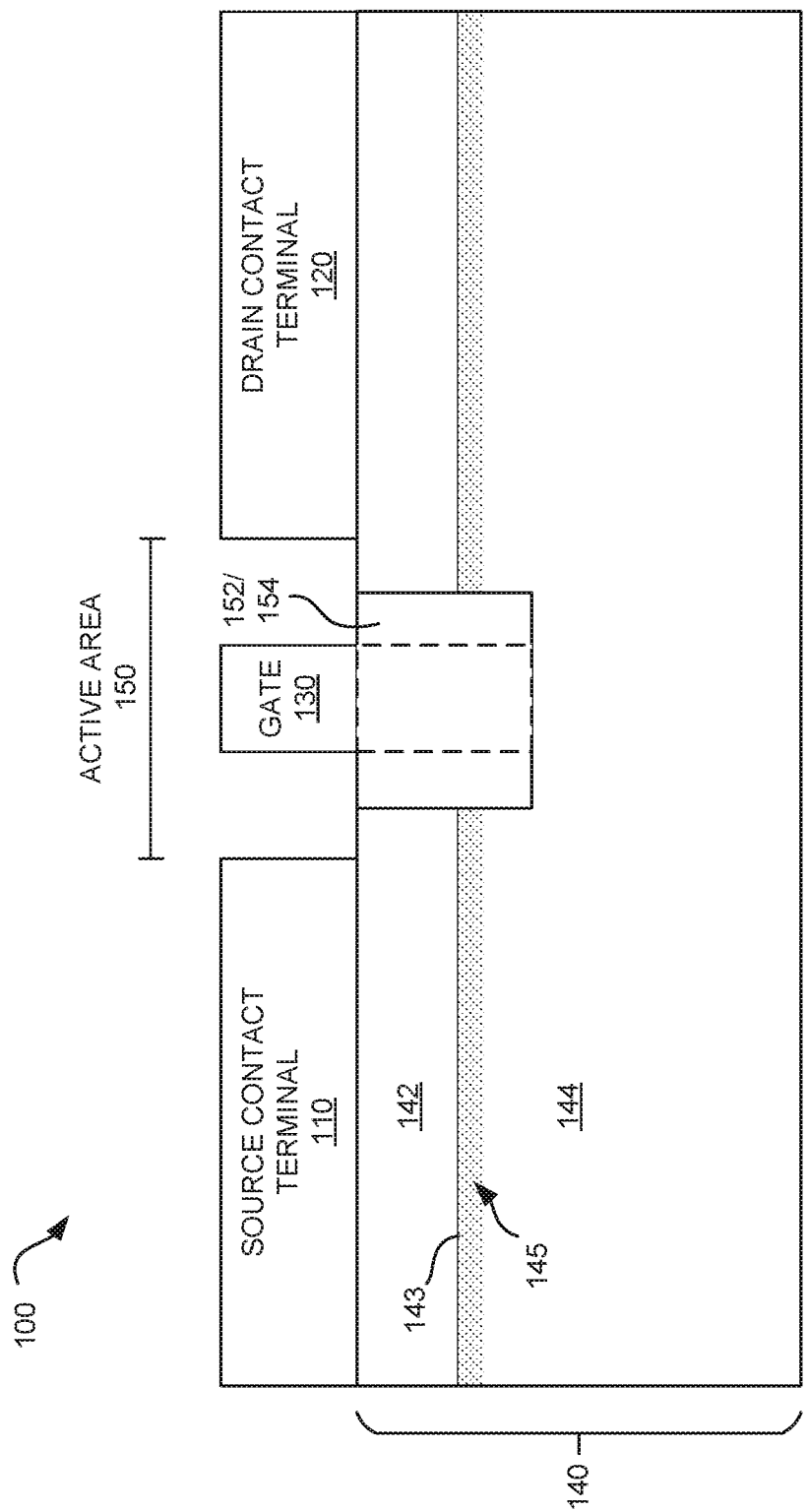
FIG. 1 is a cross-section of an example high-electron-mobility transistor (HEMT) with a gate contact terminal set down over a series of trenches and small fins.

The inventors have discovered that direct-Coupled Transistor Logic (DCTL) featuring monolithically integrated D-mode and Enhancement-mode (E-mode) HEMTs offers a simple circuit configuration and high switching speed capabilities for high power electronics applications, such as cascode drivers, as well as for low power logic applications such as direct-coupled FET logic.

AlGaN and GaN by nature have hexagonal shaped atoms that create spontaneous charge and polarization charges that stress the materials to create a 2DEG layer (heterojunction). Consequently, AlGaN/GaN HEMTs are inherently D-mode devices because a conduction channel exists without application of any voltage and a negative gate voltage must be applied to block the channel.

Previous attempts at creating AlGaN-based DCTL have faced challenges due to a lack of technology to fabricate a reliable E-mode AlGaN/GaN HEMT. In particular, previous approaches to fabricating E-mode AlGaN/GaN HEMTs include transforming the typically-negative threshold voltage to positive values using, for example, barrier-thinning, fluoride-based plasma treatment, reduction of the size of the isolation mesa, polarization-engineering through replacing the tensile strained AlGaN barrier with a compressively strained AlInGaN barrier, incorporation of InGaN back-barrier, and incorporation of a p-type gate contact. Prior art barrier-thinning and fluoride-based plasma treatment techniques result in large gate-leakage current and the possibility of hysteresis in the gate characteristics of the E-mode HEMTs due to surface damage and ease of tunneling through the thinned-barrier (for barrier thinning) and movement of the fluorine ions (for fluoride-based plasma treatment), which results in a non-reliable device performance in both techniques.

Described herein are methods to fabricate monolithically integrated Depletion-mode (D-mode) and Enhancement-mode (E-mode) HEMTs with tri-gate structure set down within an active area corrugated with small fins separated by trenches etched in the active area. The methods involve modifying the width of the fins and thereby the concentration of the two-dimensional electron sheet to create D-mode and E-mode devices without requiring significant additional fabrication steps or damage to the top surface of the transistors. In some aspects, the fin width can vary from 30-500 nanometers. Such small fin feature sizes may be realized using electron beam lithography and inductively coupled plasma—reactive ion etching (ICP-RIE). Thus, for a fabricated AlGaN/GaN HEMT with a given concentration of Al and thickness of the AlGaN layer, the threshold voltage can be varied by varying the fin width. For example, if the fabricated AlGaN/GaN HEMT is characterized by an intrinsic threshold voltage (e.g. VTH=−3V), etching mesas in the active are to create small fins, the threshold voltage can be shifted (e.g. to VTH=−1V).

As described herein, controlling the width of the fins permits parallel processing of D-mode and E-mode HEMTs without adding any major step to the fabrication process or damage to the top-surface of the mesa, wherein D-mode or E-mode functionality depends on the width of the fins. Specifically, if the fin width is made small enough (e.g. 30 nm), the threshold voltage ($V_{TH}$) will become positive for E-mode functionality.

FIG. 1 is a schematic diagram of a cross-section of an example high-electron-mobility transistor (HEMT) 100. The HEMT 100 includes a source contact terminal 110, a drain contact terminal 120, and a gate contact terminal 130. The source contact terminal 110, drain contact terminal 120, and gate contact terminal 130 are metal conductors.

The HEMT 100 further includes semiconductor layers 140 capable of sustaining a two-dimensional electron sheet to enable electrical current to flow through the HEMT 100. The two-dimensional electron sheet comprises a two-dimensional electron gas (2DEG), which is an electron gas that is free to move in two dimensions, but tightly confined in the third dimension. The semiconductor layers 140 comprise a first semiconductor layer, or barrier 142, of a first semiconductor material, and a second semiconductor layer, or channel 144, of a second semiconductor material underneath the barrier 142. The barrier 142 and channel 144 form layers that run continuously beneath the source contact terminal 110 and drain contact terminal 120 (the continuous path is not shown in the cross-section of FIG. 1, because it is out of the plane). The gate contact terminal 130 is set down within an active area 150 some of which is corrugated with small fins 154 and trenches 152, as discussed in greater detail below.

The second semiconductor material has a different band gap than the first semiconductor material, and thus a heterointerface 143 is formed between the barrier 142 and the channel 144. The channel 144 includes a region in which a two-dimensional electron sheet is formed, referred to herein as the two-dimensional electron sheet region 145. The two-dimensional electron sheet region 145 is in the channel 144 and adjacent to the heterointerface 143. The thickness of the two-dimensional electron sheet region 145 is exaggerated in the Figures for illustrative purposes, but it is to be understood that the thickness of the two-dimensional electron sheet region 145 may have a thickness of only about 1-2 nanometers. Further, it is to be understood that the channel 144 is an upper portion of a deeper layer of the second semiconductor material, below which may include the substrate wafer and any additional layer(s) epitaxially grown (not shown in FIG. 1) to accommodate lattice mismatch between the substrate wafer and the channel 144.

The second semiconductor material is selected to serve as a HEMT channel, and the first semiconductor material is selected to serve as a HEMT barrier compatible with the channel. In the present example, the first semiconductor material includes aluminum gallium nitride (AlGaN) and the second semiconductor material may include gallium nitride (GaN).

Figure 2B:
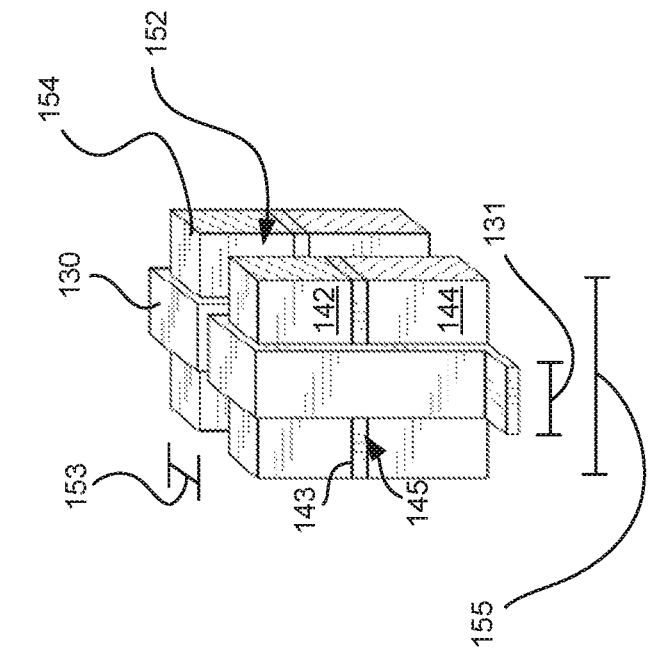
FIG. 2B is a close-up perspective view of a portion of the trenches and fins shown in FIG. 2A.
Figure 2A:
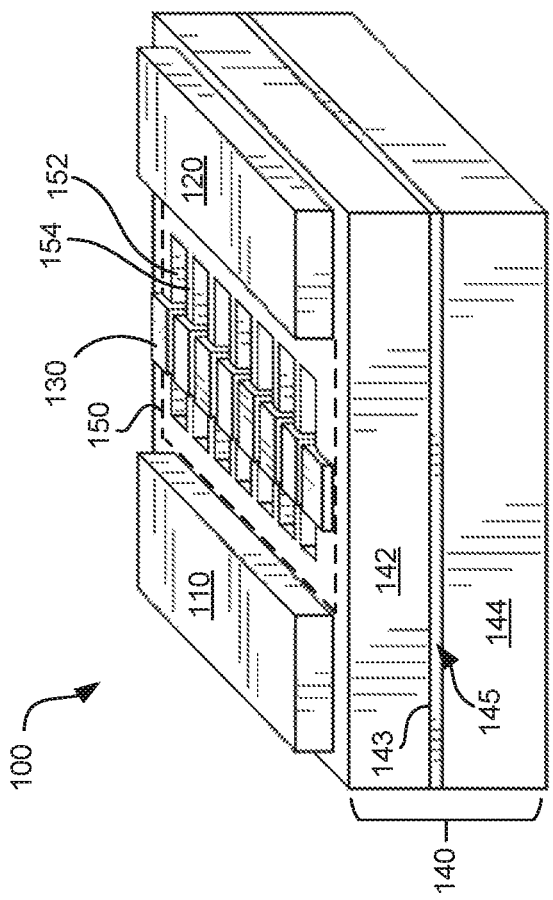
FIG. 2A is a perspective view of the HEMT of FIG. 1.

As mentioned above, the semiconductor layers 140 include the active area 150 on which a gate contact terminal 130 is to be set. The active area 150 includes a series of fins 154 having widths 153 (See FIG. 2B) of about 30 to 500 nanometers. In other words, each of the fins 154 spans a width 153 of from about 30 to 500 nanometers across. The fins 154 are separated by trenches 152 of the etched portions of the semiconductor layer 140 between the fins 154. FIGS. 2A and 2B provide perspective views of the HEMT 100 and the trenches 152 and fins 154. The active area 150 spans from an edge of the source contact terminal 110 to an edge of the drain contact terminal 120. The gate contact terminal 130 has a gate width 131. Further, the fins 154 have lengths 155 that can be equal to, less than, or larger than the gate width 131.

The gate contact terminal 130 is set down across the fins 154. The trenches 152 and fins 154 run perpendicular to the direction of the gate contact terminal 130, as shown in FIGS. 2A and 2B. The gate contact terminal 130 is situated between the source contact terminal 110 and drain contact terminal 120.

Some segments of the gate contact terminal 130 rest on top of the barrier 142 or on a thin insulator layer (the latter not shown), forming either a Schottky contact or metal-insulator-semiconductor structure. Further, some segments of the gate contact terminal 130 that run down the trenches 152 rest adjacent to the inner side walls of the trenches 152, which may be of the barrier 142 or the channel 144. Further, some segments of the gate contact terminal 130 rest on the bottoms of the trenches 152 in the channel 144.

The trenches 152 extend through the semiconductor layer 140 past a depth at which the two-dimensional electron sheet is to be formed, or in other words, past the two-dimensional electron sheet region 145. Thus, in some examples, the trenches 152 may extend about 40 nanometers into the semiconductor layer 140, depending on the depth of the heterointerface 143.

As mentioned previously, the widths 153 of the fins 154 are between to 500 nm.

Figure 3:
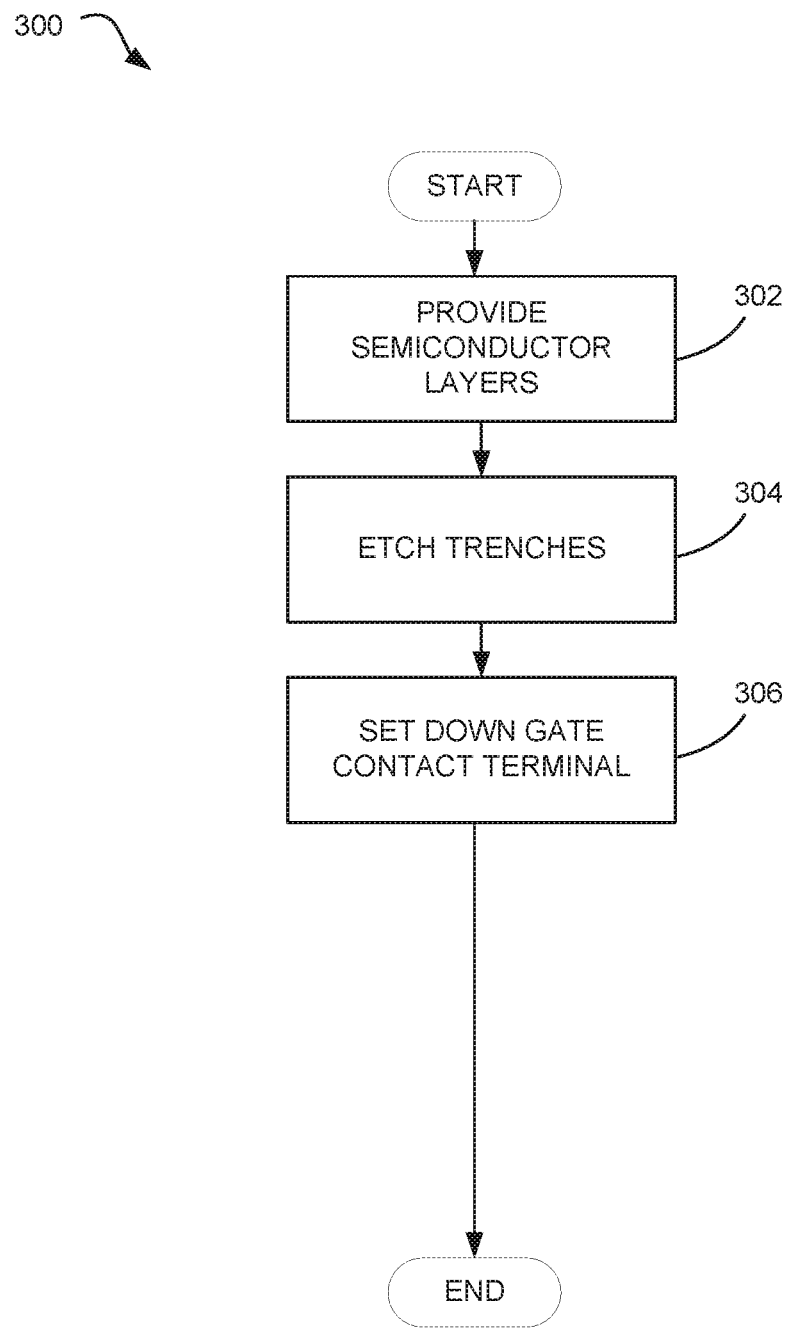
FIG. 3 is a flowchart of an example method to fabricate a gate contact terminal set down over small fin features for a HEMT.

FIG. 3 is a flowchart of an example method 300 to fabricate a gate contact terminal set down over small fins for a HEMT, which may be similar to the HEMT 100 of FIG. 1.

Figure 4A:
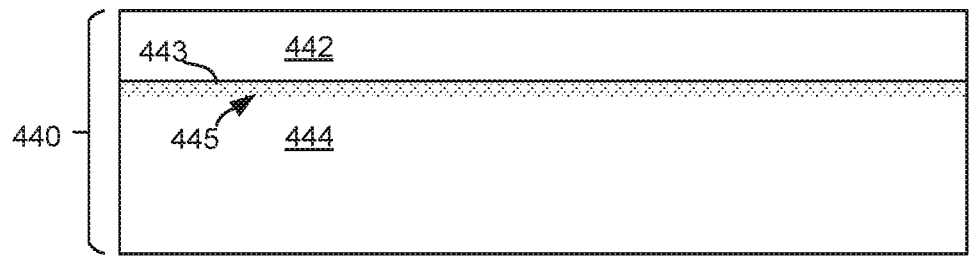
FIG. 4A a schematic diagram of a first stage of fabrication of an example of a gate contact terminal set down over small fin features, prior to dry etching of the trenches for a HEMT.

At block 302, semiconductor layers capable of sustaining a two-dimensional electron sheet to enable electrical current to flow through the HEMT are provided. The semiconductor layers may be similar to the semiconductor layers 142 and 144 of semiconductor layers 140 of FIG. 1, and thus for further description of such semiconductor layers, reference to the semiconductor layers 140 of FIG. 1 may be had. An example of semiconductor layers 440 is shown in FIG. 4A, including a barrier 442, channel 444, heterointerface 443, and two-dimensional electron sheet region 445.

Returning to FIG. 3, at block 304, a series of trenches in the semiconductor layer are etched within an active area of the semiconductor layer to create a series of fins on which a gate contact terminal is to be set down. The fins which have widths of from about 30 nm to 500 nm across and are separated by trenches. Such fins may be similar to the fins 154 of FIG. 2B, and thus for further description of such trenches, reference to the trenches 152 of FIG. 2B may be had.

Figure 4B:
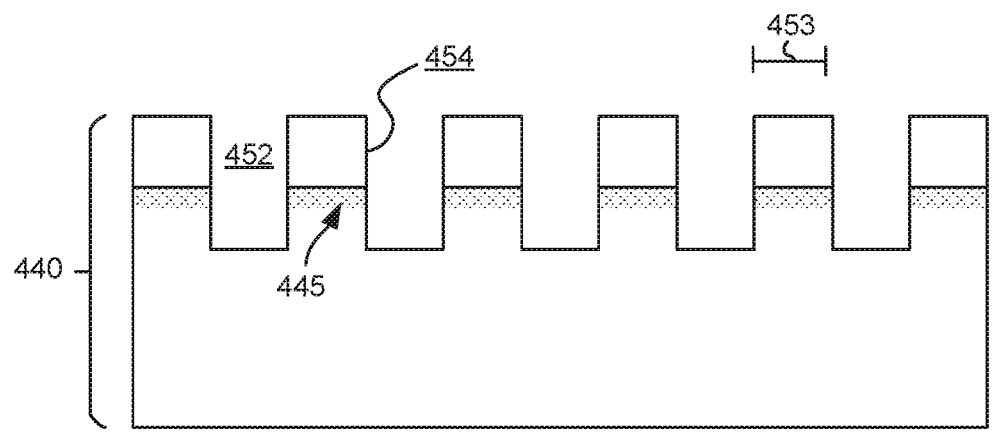
FIG. 4B is a schematic diagram of a second stage of fabrication of the active area of FIG. 4A with the fins dry etched into the semiconductor layers.

An example of semiconductor layers 440 with such trenches formed therein is shown in FIG. 4B as trenches 452 spaced apart by fins 454. In FIG. 4B, it can be seen that the trenches 452 extend through the semiconductor 440 layer past a depth at which the two-dimensional electron sheet is to be formed, or in other words, past the two-dimensional electron sheet region 445.

The trenches 452 may be formed in the semiconductor layer 440 by a combination of electron beam lithography and dry etching, as described in greater detail in FIG. 5, below.

Returning to FIG. 3, at block 306, a gate contact terminal is set down across the fins. The gate contact terminal may be similar to the gate contact terminal 130 of FIG. 1, and thus for further description of such a gate contact terminal, reference to the gate contact terminal 130 of FIG. 1 may be had.

Figure 4C:
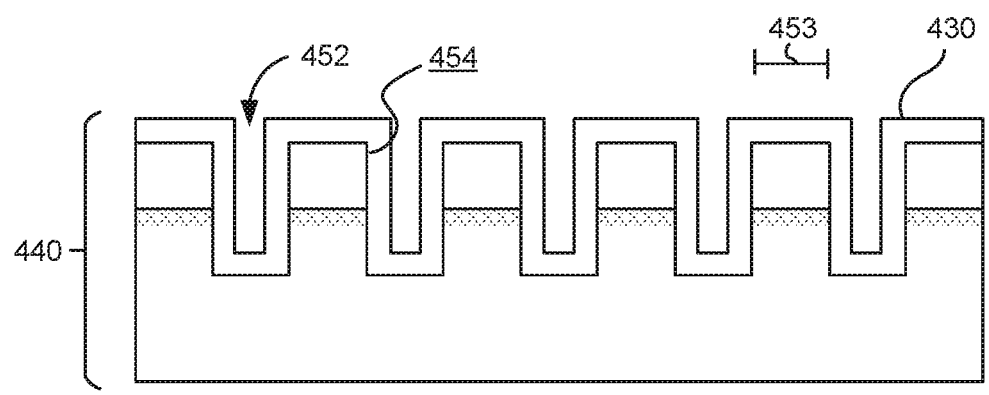
FIG. 4C is a schematic diagram of a third stage of fabrication of the active area of FIG. 4A with a gate contact terminal set down over the fins.

An example of semiconductor layers 440 with trenches 452 and fins 454 formed therein and a gate contact terminal 430 set down across the fins 454 is shown in FIG. 4C. In FIG. 4C, it can be seen that the gate contact terminal 430 is set down perpendicular to the trenches 452 and fins 454.

Figure 5:
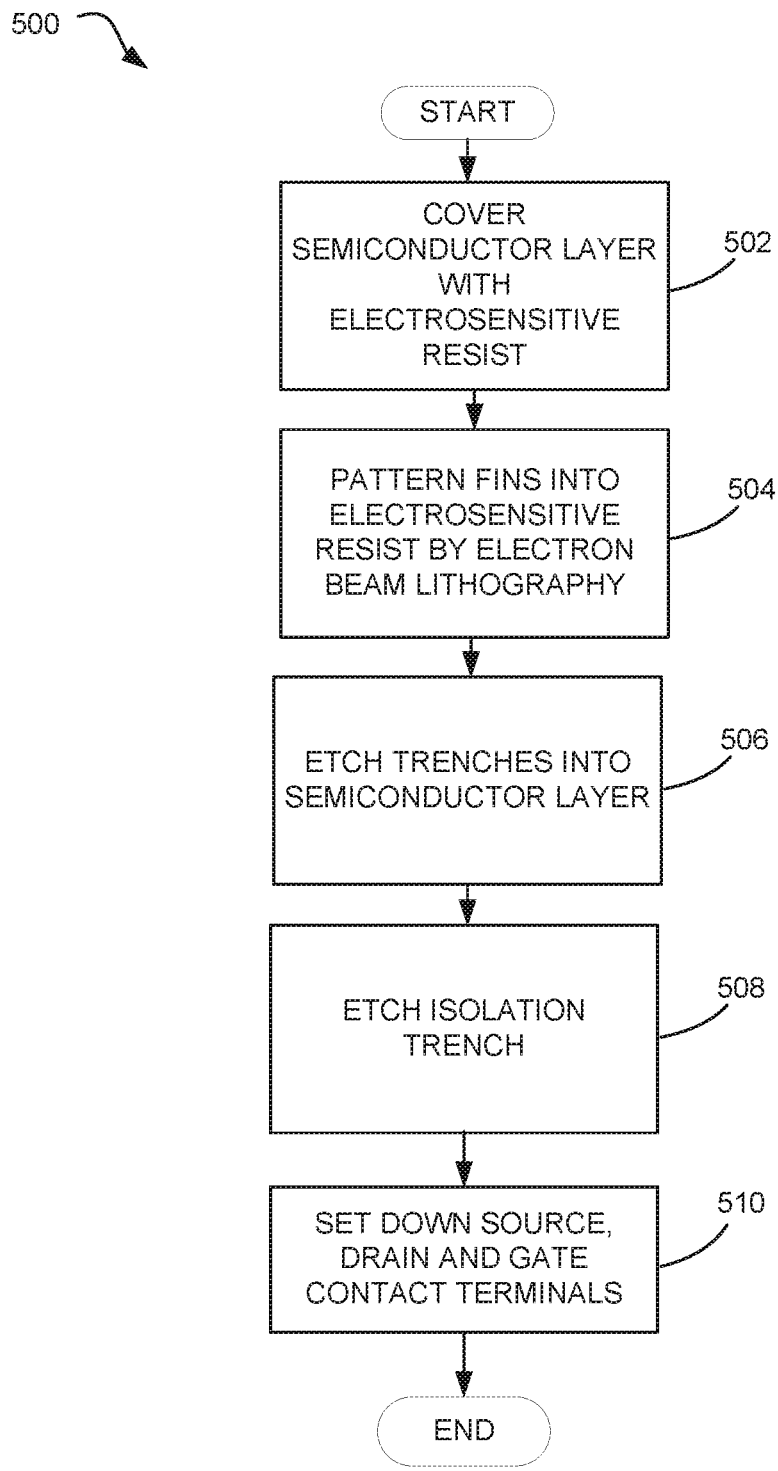
FIG. 5 is a flowchart of an example method to form integrated E-mode and D-mode AlGaN/GaN high-electron-mobility transistors (HEMT) on a single wafer.
Figure 7A:
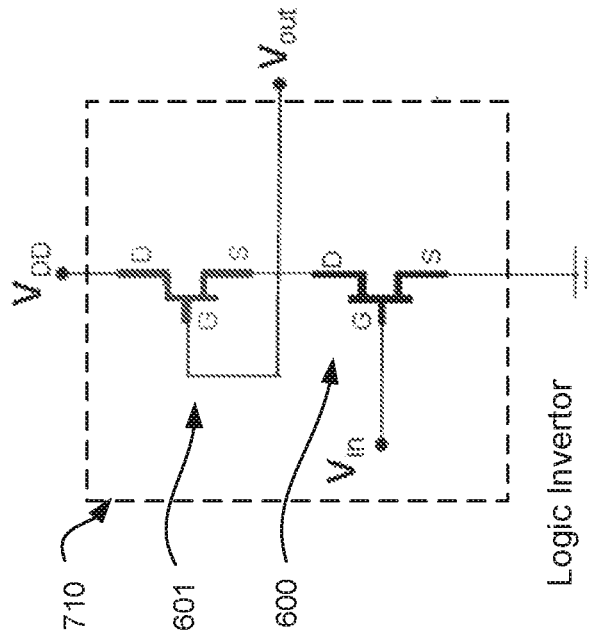
FIG. 7A is a schematic diagram of a logic inverter incorporating monolithic integration of E-mode and D-mode AlGaN/GaN high-electron-mobility transistors (HEMT).
Figure 6A:
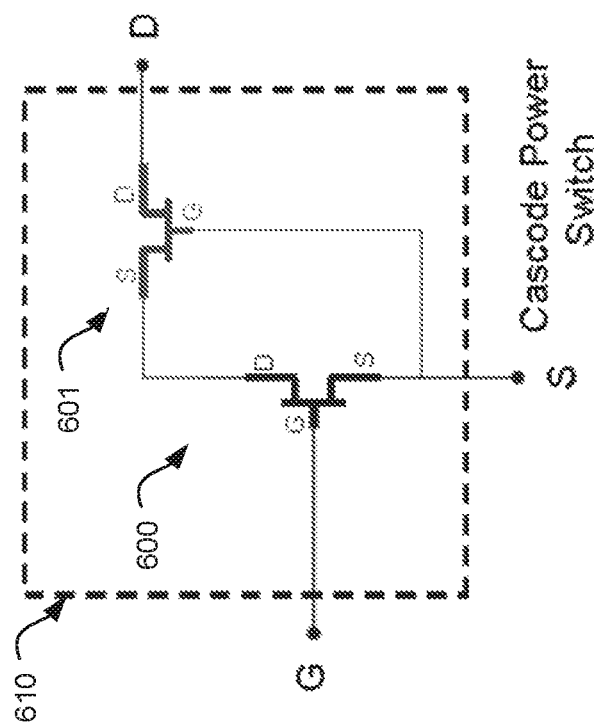
FIG. 6A is a schematic diagram of a cascode power switch incorporating monolithic integration of E-mode and D-mode AlGaN/GaN high-electron-mobility transistors (HEMT).
Figure 6B:
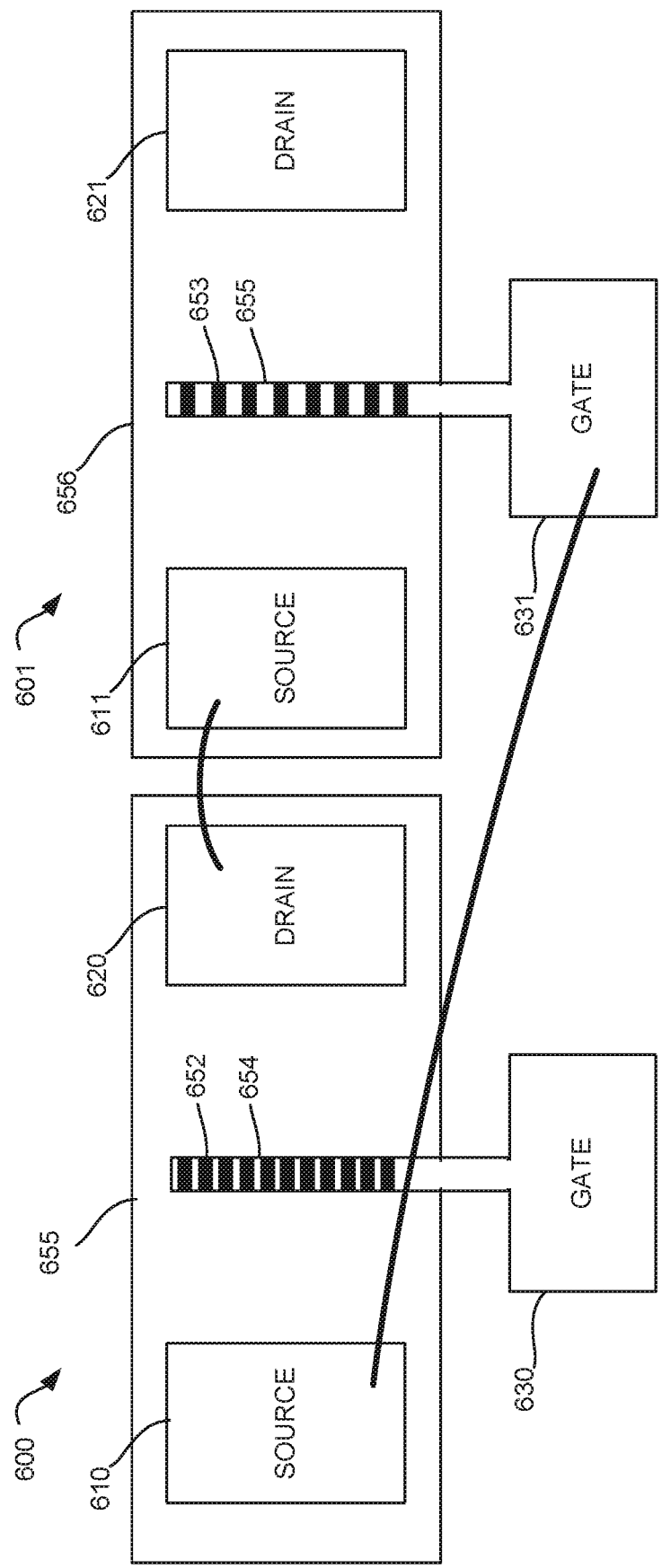
FIG. 6B is a plan view of a cascode power switch as depicted in FIG. 6A.
Figure 7B:
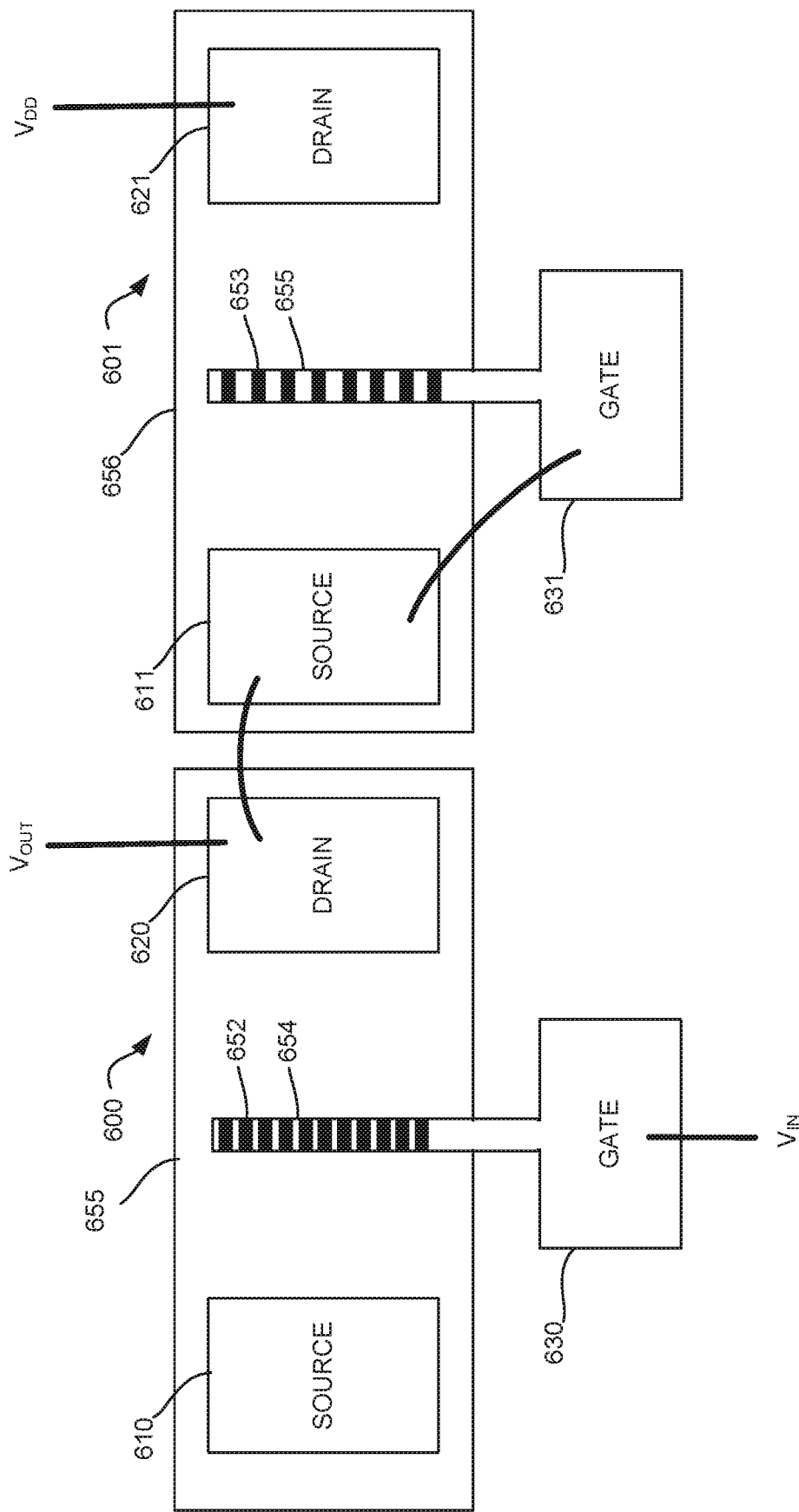
FIG. 7B is a plan view of a logic inverter as depicted in FIG. 7A.

FIG. 5 is a flowchart of an example method 500 to form multiple AlGaN/GaN HEMTs 600 and 601 with different threshold voltages, such as shown in FIGS. 6A, 6B, 7A and 7B, where FIG. 6A is a schematic diagram of a cascode power switch 610 incorporating monolithic integration of E-mode and D-mode AlGaN/GaN high-electron-mobility transistors (HEMT), FIG. 6B is a plan view of a cascode power switch as depicted in FIG. 6A, FIG. 7A is a schematic diagram of a logic inverter 710 incorporating monolithic integration of E-mode and D-mode AlGaN/GaN high-electron-mobility transistors (HEMT) and FIG. 7B is a plan view of a logic inverter as depicted in FIG. 7A. In FIGS. 6B and 7B, HEMT 600 is an E-mode device while 601 is a D-mode (normally off) device. For example, the fin width of HEMT 600 may be chosen so that $V_{TH}>0V$ (e.g. Vth=0.7V), while the fin width of HEMT 601 may be chosen so that $V_{TH}<0V$ (e.g. Vth=−3V).

At block 502, semiconductor layers equivalent to layers 440 shown in FIG. 4, are covered with an electrosensitive resist layer. The electrosensitive resist layer may include hydrogen silsesquioxane (HSQ).

At block 504, a series of fins are patterned using the electrosensitive resist layer by electron beam lithography, thereby forming a mask from the electrosensitive resist layer. The HSQ that is exposed to the electron beam of a sufficient dose is converted into silicon oxide. The unexposed HSQ can be removed as waste by an intermediate development step. The HSQ is a high-resolution resist that is particularly well-suited for this application since the exposed resist provides a suitable mask for subsequent plasma etching of the semiconductor layer. A typical polymer resist layer may not withstand the subsequent plasma etching, and alternatively, the use of a sacrificial hard mask may introduce complexity and risk of damaging the semiconductor layers.

At block 506, the series of trenches is dry etched into the semiconductor layer through the mask. The trenches may be dry etched with chlorine-based dry etching and by inductively coupled plasma—reactive ion etching (ICP-RIE). Thus, small isolation features in the form of small fins spaced part by trenches may be fabricated, with the fins having widths equal to or less than about 30 nm and as great as 500 nm.

According to an aspect of the invention, the width of the patterned fins 654 between trenches 652 of HEMT 600 at block 504 are different than the width of the fins 655 between trenches 653 of HEMT 601, resulting in different threshold voltages ($V_{TH}$) of the transistors 600 and 601, formed in parallel on a single wafer. In particular, for E-mode operation the width of the fins must be to be small enough (~30 nm) to shift the threshold voltage to a positive voltage. Further isolation trenches 655 and 656 are etched for electrically isolating HEMTs 600 and 601. At block 510, metal contact terminals are set down for sources 610 and 611, drains 620 and 621 and gates 630 and 631. The gate contact terminals 630 and 631 are set down across the fins 654 and 655. The trenches 652, 653 and fins 654,655 run perpendicular to the direction of the gate contact terminals 630, 631, as shown in FIGS. 6B and 7B. The gate contact terminals 630, 631 are situated between the source contact terminals 610, 611 and drain contact terminals 620, 621.

Thus, as shown in the plan views of FIGS. 6B and 7B, example AlGaN/GaN high-electron-mobility transistors (HEMTs) 600 and 601 include source contact terminals 610 and 611, drain contact terminals 620 and 621, and gate contact terminals 630 and 631, deposited on underlying semiconductor layers to enable electrical current to flow through the HEMTs 600 and 601 when the respective threshold voltages ($V_{TH}$) for HEMTs 600 and 601 are exceeded. In other words, HEMTs 600 and 601 turn on at different threshold voltages dependent on the width of the fins 654 and 655, respectively, wherein the width of the fins 654 in HEMT 600 is made small enough (e.g. 30 nm), or are eliminated entirely, such that HEMT 600 becomes an enhancement mode (E-mode) device.

The method of FIG. 5 results in parallel processing AlGaN/GaN HEMTs with different threshold voltages without adding any major step to the fabrication process (e.g. no additional mask) or additional damage to the top-surface of the device. AlGaN/GaN HEMTs fabricated according to the method of FIG. 5 can yield fin widths in the range of 30 nm to 500 nm.

In FIGS. 6B and 7B, metal connections between S, D and G are provided for connecting the E-mode and D-mode HEMTs 600, 601 in specific ways to create different circuits. Thus, in FIG. 6B, the drain 620 of HEMT 600 is connected to the source 611 of HEMT 601, and the gate 631 of HEMT 601 is connected to the source 610 of HEMT 600, to create the cascode driver in FIG. 6A, wherein the E-mode HEMT 600 opens and closes the driver (positive voltage to open). In FIG. 7B, the drain 620 of HEMT 600 is connected to the source 611 and gate 631 of HEMT 601 forming an output ($V_{OUT}$) for the logic inverter (NOT gate) of FIG. 7A, while the drain 621 of HEMT 601 is connected to a voltage source ($V_{DD}$) and the gate 630 of HEMT 600 is connected to an input voltage ($V_{IN}$).

Figure 8:
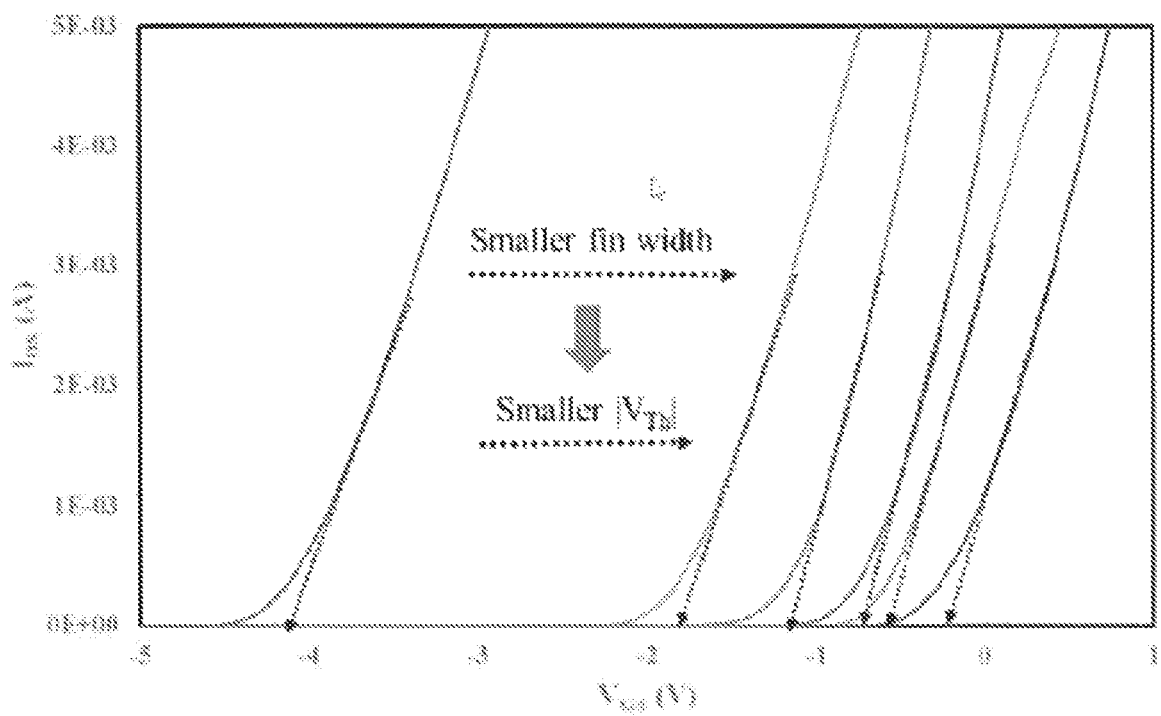
FIG. 8 is a graph showing shift in threshold voltage of a AlGaN/GaN HEMT with change of fin width.

FIG. 8 shows the shift in threshold voltage (VTH) for AlGaN/GaN HEMTs with change in fin width. As can be seen, small fin widths result in higher $V_{TH}$, due to the strain relaxation and depletion of the two-dimensional electron gas sheet due to Schottky barrier.

Thus, as described herein, controlling the threshold voltage of HEMTs 600 and 601 results in monolithic integration of enhancement-mode and depletion-mode AlGaN/GaN high-electron-mobility transistors (HEMT) to create high power electronic devices on a single wafer, such as the cascode power switch of FIGS. 6A and 6B, and low power and high switching speeds logic FETs, such as the logic inverter of FIGS. 7A and 7B.

Such HEMTs may be produced with small fin isolation features and without the need for a separate sacrificial mask, thereby minimizing the risk of damage to the surface of the semiconductor layers. Such reliable HEMTs may be applicable in radio frequency (RF), power electronics, and digital applications, and may be particularly useful in extreme temperature and harsh environments such as automotive and aerospace engine controls, well logging in petroleum exploration, and nuclear reactors, due to the fact that GaN-based devices have fundamental advantages over conventional Si and GaAs devices for high-temperature operations.

It should be recognized that features and aspects of the various examples provided above can be combined into further examples that also fall within the scope of the present disclosure. For example, the cascode power switch 610 and the logic invertor 710 are only two examples monolithic integration of E-mode and D-mode devices, although a person of ordinary skill in the rat will understand that other examples are possible using the principles set forth herein. The scope of the claims should not be limited by the above examples but should be given the broadest interpretation consistent with the description as a whole.

The invention claimed is:

1. A method of fabricating a wafer containing a plurality of high-electron-mobility transistors (HEMTs), the method comprising:
   providing semiconductor layers capable of sustaining a two-dimensional electron sheet to enable electrical current to flow through the HEMTs,
   wherein the semiconductor layers comprise a first layer of aluminum gallium nitride (AlGaN) and a second layer of gallium nitride (GaN),
   whereby the concentration of Al and thickness of AlGaN give rise to a characteristic threshold voltage;
   for a first one of said HEMTs:

forming a series of first trenches and first fins in the semiconductor layers over a first active area of the semiconductor layers on which a first gate contact terminal of the first one of said HEMTs is to be set down, wherein the width of the first fins is chosen to shift the characteristic threshold voltage to a new threshold voltage;

setting down the first gate contact terminal across the first fins; and setting down a first source contact terminal and a first drain contact terminal on either side of the first gate contact terminal outside of the first active area; and for a further one of said HEMTs:

forming a series of further trenches and further fins in the semiconductor layers over a further active area of the semiconductor layers on which a further gate contact terminal of the HEMT is to be set down, wherein the width of the further fins is less than the width of the first fins to shift the characteristic threshold voltage below the new threshold voltage of the first one of said HEMTs;

setting down a further gate contact terminal across the further series of fins; and setting down a further source contact terminal and a further drain contact terminal on either side of the further gate contact terminal outside of the further active area, wherein the width of each of the first fins is selected to increase the characteristic threshold voltage such that the first one of said HEMTs operates as a depletion mode HEMT, and wherein the width of the further fins is selected to decrease the characteristic threshold voltage to a voltage such that the further one of said HEMTs operates as an enhancement mode HEMT.

2. The method of claim 1, wherein forming the series of trenches and fins comprises:

covering the semiconductor layers with an electrosensitive resist layer;

patterning the fins into the electrosensitive resist layer by electron beam lithography to form a mask; and dry etching the trenches into the semiconductor layers through the mask.

3. The method of claim 2, wherein dry etching the series of trenches into the semiconductor layers comprises inductively coupled plasma—reactive ion etching (ICP-RIE).

4. The method of claim 2, wherein the electrosensitive resist layer comprises hydrogen silsesquioxane (HSQ).

5. The method of claim 1, wherein the gate contact terminals are set down perpendicular to the fins.

6. The method of claim 1, wherein the trenches extend through the semiconductor layers past a depth at which the two-dimensional electron sheet is to be formed.

7. A device incorporating monolithic integration of E-mode and D-mode AlGaN/GaN high-electron-mobility transistors (HEMTs), comprising: semiconductor layers comprising a first layer of aluminum gallium nitride (AlGaN) and a second layer of gallium nitride (GaN), said layers being capable of sustaining a two-dimensional electron sheet to enable electrical current to flow, the semiconductor layers comprising a plurality of active areas on which gate contact terminals are to be set down, the active areas comprising a series of trenches and fins, the fins having different widths over each active area;

a plurality of drain contact terminals adjacent respective ones of the active areas;

a plurality of source contact terminals adjacent respective ones of the active areas; and a plurality of gate contact terminals set down across the fins of respective ones of the active areas, such that the device comprises a plurality of AlGaN/GaN high-electron-mobility transistors (HEMTs) having different threshold voltages, and wherein for a first one of said HEMTs the width of each of the fins is selected to increase the characteristic threshold voltage such that the first one of said HEMTs operates as a depletion mode HEMT, and wherein for a further one of said HEMTs the width of the fins is selected to decrease the characteristic threshold voltage to a voltage such that the further one of said HEMTs operates as an enhancement mode HEMT.

8. The device of claim 7, wherein the gate contact terminals are set down perpendicular to the fins.

9. The device of claim 7, wherein the trenches extend through the semiconductor layers past a depth at which the two-dimensional electron sheet is to be formed.

10. The device of claim 7, further including at least one isolation trench between each respective one of the HEMTs.

11. The device of claim 7, wherein the gate contact of the depletion mode HEMT is connected to the source contact of the enhancement mode HEMT and the source contact of the depletion mode HEMT is connected to the drain contact of the enhancement mode HEMT, such that the device operates as a cascode power switch.

12. The device of claim 7, wherein the gate contact of the depletion mode HEMT is connected to the source contact of the depletion mode HEMT, the source contact of the depletion mode HEMT is connected to the drain contact of the enhancement mode HEMT, drain contact of the depletion mode HEMT is connected to a source of voltage ($V_{DD}$), the gate contact of the enhancement mode HEMT is connected to an input and the gate contact of the depletion mode HEMT is connected to an output, such that the device operates as a logic inverter.

13. The device of claim 7, wherein the width of each of the fins of the depletion mode HEMT is in the range of from 30 nm to 500 nm.

14. The device of claim 7, wherein the width of each of the fins of the enhancement mode HEMT is less than 30 nm.

15. The device of claim 14, wherein the width of each of the fins of the enhancement mode HEMT is zero so as to be eliminated entirely.

* * * * *